(12) United States Patent
Chiu et al.

(10) Patent No.: US 8,471,249 B2
(45) Date of Patent: Jun. 25, 2013

(54) CARBON FIELD EFFECT TRANSISTORS HAVING CHARGED MONOLAYERS TO REDUCE PARASITIC RESISTANCE

(75) Inventors: Hsin-Ying Chiu, White Plains, NY (US); Shu-Jen Han, Cortlandt Manor, NY (US); Hareem T. Maune, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/104,591

(22) Filed: May 10, 2011

(65) Prior Publication Data
US 2012/0286244 A1    Nov. 15, 2012

(51) Int. Cl.
*H01L 29/08* (2006.01)

(52) U.S. Cl.
USPC 257/40; 257/414; 257/E29.166; 257/E21.002; 438/49

(58) Field of Classification Search
USPC .......................................................... 257/40
See application file for complete search history.

(56) References Cited

U.S. PATENT DOCUMENTS

| | | | |
|---|---|---|---|
| 6,486,489 B2 * | 11/2002 | Watanabe et al. | 257/9 |
| 6,515,339 B2 | 2/2003 | Shin et al. | |
| 6,750,471 B2 | 6/2004 | Bethune et al. | |
| 6,891,227 B2 | 5/2005 | Appenzeller et al. | |
| 7,015,547 B2 * | 3/2006 | Hackler et al. | 257/347 |
| 7,396,717 B2 | 7/2008 | Wang et al. | |
| 7,402,872 B2 | 7/2008 | Murthy et al. | |
| 7,582,534 B2 | 9/2009 | Afzali-Ardakani et al. | |
| 7,639,524 B2 * | 12/2009 | Kang et al. | 365/151 |
| 7,666,771 B2 | 2/2010 | Krull et al. | |
| 7,709,880 B2 | 5/2010 | Bertin et al. | |
| 7,714,358 B2 | 5/2010 | Liu et al. | |
| 7,754,526 B2 * | 7/2010 | Jiang et al. | 438/99 |
| 7,755,115 B2 * | 7/2010 | Awano | 257/288 |
| 7,838,912 B2 | 11/2010 | Niwa et al. | |
| 7,854,826 B2 * | 12/2010 | So et al. | 204/403.01 |
| 7,893,466 B2 | 2/2011 | Yang et al. | |
| 8,017,938 B2 * | 9/2011 | Gomez et al. | 257/40 |
| 2004/0200734 A1 * | 10/2004 | Co et al. | 205/777.5 |
| 2005/0156203 A1 * | 7/2005 | Bae et al. | 257/213 |
| 2005/0212014 A1 * | 9/2005 | Horibe et al. | 257/213 |
| 2005/0212394 A1 * | 9/2005 | Lin et al. | 313/309 |
| 2006/0052947 A1 | 3/2006 | Hu | |

(Continued)

OTHER PUBLICATIONS

The International Search Report and Written Opinion of the International Searching Authority, dated Jun. 4, 2012 for PCT/US12/24968.

(Continued)

*Primary Examiner* — N Drew Richards
*Assistant Examiner* — Ankush Singal
(74) *Attorney, Agent, or Firm* — Vazken Alexanian; Ryan, Mason & Lewis, LLP

(57) ABSTRACT

Carbon transistor devices having channels formed from carbon nanostructures, such as carbon nanotubes or graphene, and having charged monolayers to reduce parasitic resistance in un-gated regions of the channels, and methods for fabricating carbon transistor devices having charged monolayers to reduce parasitic resistance. For example, a carbon field effect transistor includes a channel comprising a carbon nanostructure formed on an insulating layer, a gate structure formed on the channel, a monolayer of DNA conformally covering the gate structure and a portion of the channel adjacent the gate structure, an insulating spacer conformally formed on the monolayer of DNA, and source and drain contacts connected by the channel.

24 Claims, 6 Drawing Sheets

U.S. PATENT DOCUMENTS

| | | | |
|---|---|---|---|
| 2006/0240605 A1* | 10/2006 | Moon et al. | 438/149 |
| 2007/0069212 A1* | 3/2007 | Saitoh et al. | 257/59 |
| 2007/0114593 A1* | 5/2007 | Radosavljevic et al. | 257/317 |
| 2008/0017899 A1* | 1/2008 | Appenzeller et al. | 257/288 |
| 2008/0021339 A1* | 1/2008 | Gabriel et al. | 600/532 |
| 2008/0035913 A1 | 2/2008 | Lake et al. | |
| 2008/0094078 A1* | 4/2008 | So et al. | 324/692 |
| 2008/0151603 A1* | 6/2008 | Radosavljevic et al. | 365/151 |
| 2008/0169472 A1* | 7/2008 | Bryant et al. | 257/66 |
| 2008/0252202 A1* | 10/2008 | Li et al. | 313/504 |
| 2009/0072223 A1* | 3/2009 | Awano | 257/24 |
| 2009/0166686 A1* | 7/2009 | Hunt et al. | 257/288 |
| 2009/0201743 A1* | 8/2009 | Yang | 365/185.28 |
| 2009/0224230 A1* | 9/2009 | Pesetski et al. | 257/24 |
| 2009/0267647 A1 | 10/2009 | Kim et al. | |
| 2009/0303801 A1* | 12/2009 | Kim | 365/189.05 |
| 2010/0025660 A1 | 2/2010 | Jain et al. | |
| 2010/0032653 A1* | 2/2010 | Takeda et al. | 257/24 |
| 2010/0065818 A1* | 3/2010 | Kim et al. | 257/14 |
| 2010/0075469 A1* | 3/2010 | Liu et al. | 438/151 |
| 2010/0133512 A1* | 6/2010 | Parikh et al. | 257/24 |
| 2010/0133516 A1* | 6/2010 | Lee et al. | 257/24 |
| 2010/0163858 A1* | 7/2010 | Toguchi et al. | 257/40 |
| 2010/0181209 A1* | 7/2010 | Yoo et al. | 205/775 |
| 2010/0207102 A1* | 8/2010 | Lee et al. | 257/24 |
| 2010/0213435 A1* | 8/2010 | Fujii et al. | 257/9 |
| 2011/0017979 A1* | 1/2011 | Meric et al. | 257/29 |
| 2011/0033952 A1* | 2/2011 | Khater et al. | 436/518 |
| 2011/0057190 A1* | 3/2011 | Kimura et al. | 257/59 |
| 2011/0068323 A1 | 3/2011 | Chen et al. | |
| 2011/0068324 A1* | 3/2011 | Matsumoto et al. | 257/24 |
| 2011/0101308 A1 | 5/2011 | Avouris et al. | |
| 2011/0180884 A1* | 7/2011 | Lazarus et al. | 257/414 |
| 2011/0215315 A1* | 9/2011 | Toguchi et al. | 257/40 |
| 2011/0248243 A1* | 10/2011 | Chen et al. | 257/29 |
| 2012/0000274 A1* | 1/2012 | Fife | 73/61.41 |
| 2012/0108075 A1* | 5/2012 | Gordon et al. | 438/758 |
| 2012/0134880 A1* | 5/2012 | Kurkina et al. | 422/82.01 |

OTHER PUBLICATIONS

Y. Lu et al., "DNA Functionalization of Carbon Nanotubes for Ultrathin Atomic Layer Deposition of High κ Dielectrics for Nanotube Transistors with 60 mV/Decade Switching," J. Am. Chem. Soc., 2006, pp. 3518-3519, vol. 128, No. 11.

D. Porath et al,, "Direct Measurement of Electrical Transport Through DNA Molecules," Nature, 2000, pp. 635-638, vol. 403.

A. J. Storm et al., "Insulating Behavior for DNA Molecules Between Nanoelectrodes at the 100 nm Length Scale," Appl. Phys. Lett., 2001, pp. 3881-3883, vol. 79, No. 23.

T. K. Sasaki et al., "DNA-FET Using Carbon Nanotube Electrodes," J. Phys. Conf. Ser., 2006, pp. 41-44, vol. 38.

\* cited by examiner

CARBON FIELD EFFECT TRANSISTORS HAVING CHARGED MONOLAYERS TO REDUCE PARASITIC RESISTANCE

TECHNICAL FIELD

This invention relates generally to carbon field effect transistors having charged monolayers to reduce parasitic resistance, and methods for constructing carbon field effect transistors having charged monolayers to reduced parasitic resistance.

BACKGROUND

The integration of carbon nanostructures as channel materials in the next generation of electronic devices offers many advantages over the continued scaling of silicon (Si). Carbon nanostructures such as carbon nanotubes and graphene are two nanoscale forms of carbon that exhibit extremely high current carrying capacity and mobilities, which are several orders of magnitude beyond the theoretical limit for Si. Furthermore, carbon nanotubes (one-dimensional) and graphene (two-dimensional) are low-dimensional (ultra-thin-body) materials, which allows them to be aggressively scaled in FETs (field-effect transistors) without incurring deleterious short-channel effects that hinder modern scaled devices.

With some conventional FET structures having channels formed of carbon nanotube or graphene, there is overlap between the source/drain electrodes and the gate electrode such that the channel region between the source/drain electrodes is completely gated. However, the overlap between the source/drain electrodes and the gate electrode results in parasitic capacitance, which degrades the circuit performance. To reduce this parasitic capacitance, some conventional FET structures having carbon nanotube or graphene channels are formed having non-overlapping source/drain and gate electrodes With these structures, a performance bottleneck arises due to a high parasitic resistance in the un-gated portion of the channel that results from the underlap between the source/drain electrodes and the gate.

In particular, with conventional FET structures, spacers are used to isolate the gate electrode form the source and drain electrodes. The un-gated channel region under the spacer provides a high resistance region within the channel of the FET. With conventional Si CMOS devices, extension doping can be used to reduce the resistance of the channel region under the spacers. However, with graphene and carbon nanotube FET devices, the channel cannot be doped by conventional methods. Thus, methods for reducing the parasitic resistance of un-gated regions of carbon nanostructure channels of FETs are desired.

SUMMARY OF THE INVENTION

Aspects of the invention include carbon transistor devices having channels formed from carbon nanostructures, such as carbon nanotubes or graphene, and charged monolayers to reduce parasitic resistance in un-gated regions of the channels, and methods for fabricating carbon transistor devices having charged monolayers to reduce parasitic resistance.

In one aspect of the invention, a transistor device includes a substrate and an insulating layer formed on the substrate. A channel comprising a carbon nanostructure is formed on the insulating layer. A gate structure is formed on the channel A charged monolayer conformally covers the gate structure and a portion of the channel adjacent the gate structure. An insulating spacer is conformally formed on the charged monolayer. Source and drain contacts are formed on the channel.

In another aspect, a semiconductor integrated circuit includes an insulating substrate and a plurality of carbon transistor devices formed on the insulating substrate. Each of the carbon transistor devices includes a channel comprising a carbon nanostructure formed on the insulating substrate, a gate structure formed on the channel, a charged monolayer conformally covering the gate structure and a portion of the channel adjacent the gate structure, an insulating spacer conformally formed on the charged monolayer, and source and drain contacts formed on the channel.

In yet another aspect of the invention, a carbon field effect transistor includes a channel comprising a carbon nanostructure formed on an insulating layer. A gate structure is formed on the channel and a monolayer of DNA conformally covers the gate structure and a portion of the channel adjacent the gate structure. An insulating spacer is conformally formed on the monolayer of DNA, and source and drain contacts formed on the channel.

In another aspect of the invention, a method of forming a transistor device includes forming a channel layer on a substrate, the channel layer comprising a carbon nanostructure material, forming a gate structure on the channel layer, forming a charged monolayer conformally covering the gate structure and a portion of the channel layer adjacent the gate structure, forming an insulating spacer conformally on the charged monolayer, and forming source and drain contacts on exposed portions of the channel.

These and other aspects, features and advantages of the present invention will become apparent from the following detailed description of preferred embodiments, which is to be read in conjunction with the accompanying figures.

BRIEF DESCRIPTION OF THE DRAWINGS

FIGS. 2A, 2B, 2C, 2D, 2E, 2F, 2G, 2H, 2I and 2J schematically illustrate a method for constructing a carbon nanostructure transistor device having charged monolayer to reduce parasitic resistance, according to an exemplary embodiment of the invention, wherein:

FIG. 2A is a cross-sectional view of a carbon nanostructure transistor device at an initial stage of fabrication comprising a multilayer stack including a substrate, an insulating layer, a carbon channel layer, a gate dielectric material layer, and a gate electrode material layer, FIG. 2B is a cross-sectional view of the structure of FIG. 2A after forming an etch mask to define a gate region, FIG. 2C is a cross sectional view of the structure of FIG. 2B after etching the gate electrode material layer to form a gate electrode, FIG. 2D is a cross-sectional view of the structure of FIG. 2C after etching the gate dielectric material layer down to the channel layer, FIG. 2E is a cross sectional view of the structure of FIG. 2D after forming a charged monolayer that conformally covers a gate stack and an exposed surface of the channel layer, FIG. 2F is a cross sectional view of the structure of FIG. 2E after forming a photolithographic mask to etch the charged monolayer, FIG. 2G is a cross sectional view of the structure of FIG. 2F after growing an insulating layer on a surface of the charged monolayer, FIG. 2H is a cross-sectional view of the structure of FIG. 2G after depositing a layer of metallic material to form source/drain contacts, FIG. 2I is a cross-sectional view of the structure of FIG. 2H after forming a photolithographic mask to etch the layer of metallic material, and FIG. 2J is a cross-sectional view of the structure of FIG. 2I after etching the layer of metallic material (exposed through the mask) down to the insulating spacer layer above the gate stack to form separate source/drain contacts.

DETAILED DESCRIPTION OF THE PREFERRED EMBODIMENTS

Preferred embodiments of the invention will now be described in further detail with reference to transistor devices having channels formed from carbon nanostructures, such as carbon nanotubes or graphene, and charged monolayers to reduce parasitic resistance of the channels, and methods for fabricating the transistor devices. It is to be understood that the invention is not limited to the particular materials, features, and processing steps shown and described herein. Modifications to the illustrative embodiments will become apparent to those of ordinary skill in the art. It should also be understood that the various layers and/or regions shown in the accompanying figures are not drawn to scale, and that one or more semiconductor layers and/or regions of a type commonly used in such integrated circuits may not be explicitly shown in a given figure for ease of explanation. Particularly with respect to processing steps, it is to be emphasized that the descriptions provided herein are not intended to encompass all of the processing steps that may be required to form a functional integrated semiconductor device. Rather, certain processing steps that are commonly used in forming semiconductor devices, such as, for example, wet cleaning and annealing steps, are purposefully not described herein for economy of description. However, one of ordinary skill in the art will readily recognize those processing steps omitted from these generalized descriptions.

Figure 1:
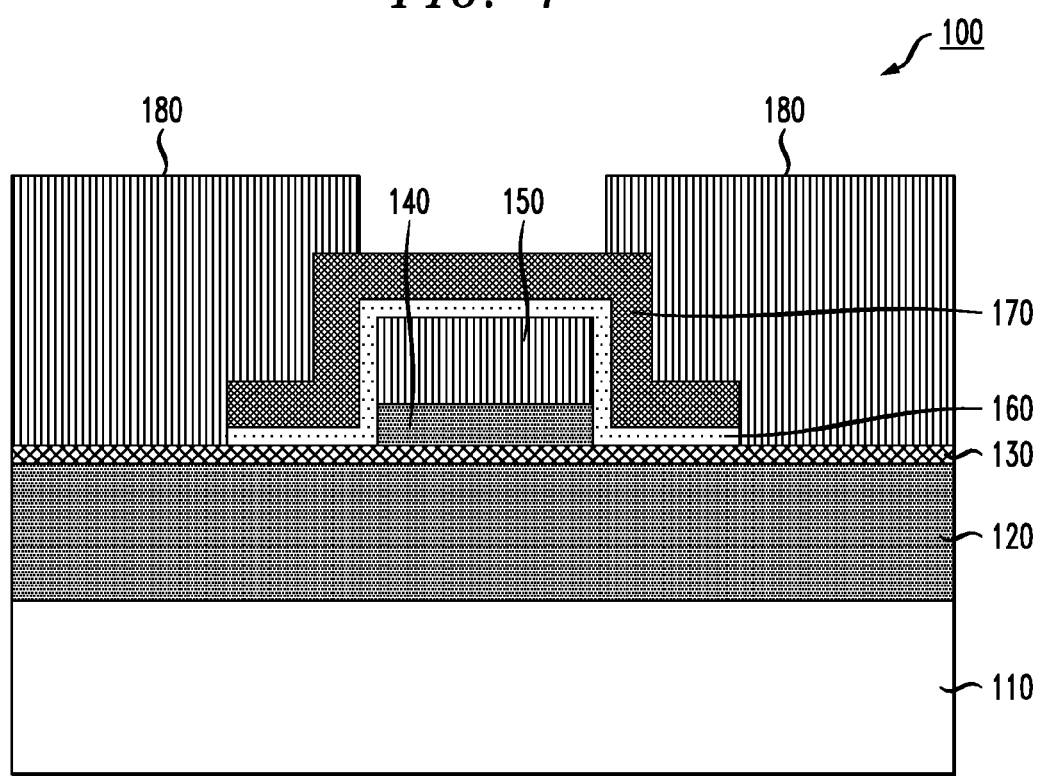
FIG. 1 is a cross-sectional view of a carbon nanostructure transistor device having a charged monolayer to reduce parasitic resistance, according to an exemplary embodiment of the invention.

FIG. 1 is a cross-sectional view of a carbon nanostructure transistor device having a charged monolayer to reduce parasitic resistance, according to an exemplary embodiment of the invention. In particular, FIG. 1 shows a field effect transistor 100 comprising a substrate 110, an insulating layer 120 on the substrate 110, a channel 130 comprising a carbon nanostructure formed on the insulating layer 120, a gate structure 140/150 formed on the channel 130, a charged monolayer 160 conformally covering the gate structure 140/150 and a portion of the channel 130 adjacent the gate structure 140/150, an insulating spacer 170 conformally formed on the charged monolayer 160, and source/drain electrodes 180, in contact with, and connected by the channel 130.

The substrate 110 may be formed of Si and the insulating layer 120 may be an oxide layer such as silicone dioxide. The gate structure 140/150 comprises a gate dielectric 140 and a gate electrode 150. The gate electrode 150 is separated from the channel 130 by the gate dielectric 140. The source/drain electrodes 180 are formed in contact with the channel 130 on opposite ends of the channel 130 adjacent the gate structure 140/150. The source/drain electrodes 180 are connected to each other by the channel 130. The gate 140/150 regulates electron flow through the channel 130 between the source/drain electrodes 180. The channel 130 may be formed of carbon nanostructure such as one or more carbon nanotubes or a graphene.

In the device geometry of FIG. 1, the source/drain electrodes 180 and the gate electrode 150 have no overlap, which minimizes the parasitic gate-source and gate-drain capacitances, resulting in maximized operation speed. However, the ungated region of the channel 130 under the spacers 170 on each side of the gate would provide a high resistance region in the carbon nanostructure channel 130. The charged monolayer 160 between the spacer 170 and channel 130 serves to "electrostatically dope" the ungated portions of the channel 130 under the spacer 170 to reduce the parasitic resistance of the channel 130 between the source/drain electrodes 180. In particular, the charged monolayer 160 is formed of a material that induces charge in the ungated region of the channel 130 under the spacer 170.

The charged monolayer 160 can be formed of any suitable material that can induce a charge in the channel layer 130 while providing insulation between the gate electrode 150 and the channel 130 so that the gate 150 is not electrically shorted to the channel 130. In one embodiment, the charged monolayer 160 is formed of DNA material, which provides insulation between the gate and channel, while having charge to induce charge in the channel layer. The charged monolayer 160 may be formed of any suitable organic material or biomolecules. The charged monolayer 160 may be a self-assembled monolayer of material that has the characteristics of providing insulation between the gate electrode 150 and channel 130, while having charge to induce charge in the channel layer 130. Furthermore, as discussed in further detail below, the charged monolayer 160 serves as a seed layer or base upon which to grow the insulating spacer 170, thereby providing a self-aligned spacer fabrication step.

Figure 2A:
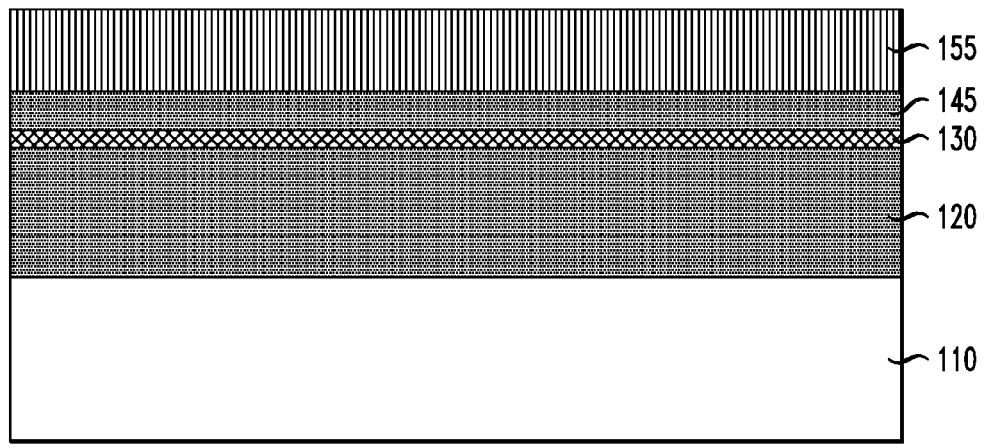

FIGS. 2A, 2B, 2C, 2D, 2E, 2F, 2G, 2H, 2I, and 2J schematically illustrate a method for constructing a carbon nanostructure transistor device having a charged monolayer to reduce parasitic resistance, according to an exemplary embodiment of the invention. In particular, FIGS. 2A, 2B, 2C, 2D, 2E, 2F, 2G, 2H, 2I, and 2J are cross-sectional views of a portion of the semiconductor FET device 100 of FIG. 1 at various stages of fabrication. FIG. 2A is a cross-sectional view of the FET device 100 at an initial stage of fabrication wherein a multilayer stack is formed comprising the substrate 110, the insulating layer 120, the carbon channel layer 130, a gate dielectric material layer 145 formed over the channel layer 130 and a gate electrode material layer 155 formed over the gate dielectric material layer 145.

The stack structure of FIG. 2A may be fabricated by depositing insulating material over a bulk substrate form the insulating layer 120 on the substrate 110. The substrate 110 can be a silicon substrate (heavily doped or lightly doped) and the insulating layer 120 can be formed of an oxide material such as SiO2 or a nitride material such as Si3N4. The thickness of the insulating layer 120 can be in a range of 10 nm to several um, as long as it provides sufficient insulating property.

The carbon channel layer 130 comprises a carbon nanostructure, such as carbon nanotubes or graphene, which is formed on the insulating layer 120 to serve as a channel of the FET device. A variety of known methods can be used to form carbon nanotube or graphene channel layer 130 on the insulating layer 120. By way of example only, transfer techniques such as transfer from a growth substrate for carbon nanotubes or exfoliation for graphene can be employed. These transfer processes are known to those of ordinary skill in the art and thus details of such processes are not described further herein. In other embodiments, carbon materials such as carbon nanotube or graphene can be deposited or grown on the insulating layer 120 using random disperse (from solution) and other known methods such as chemical vapor deposition (CVD) techniques.

The gate dielectric material layer 145 may be formed of one or more of various types of known dielectric materials such as silicon dioxide (SiO2), silicon nitride (Si3N4), hafnium oxide (HfO2) or other high K (dielectric constant) materials, which are deposited by chemical vapor deposition (CVD) or atomic layer deposition (ALD) or other known methods. The gate dielectric material layer 145 may be formed with a thickness of less than about 10 nanometers (nm), e.g., to a thickness from about three nm to about 10 nm. The gate dielectric material layer 145 may comprise a high K dielectric material, such as TiO2 and HfO2, etc., to increase the device transconductance.

The gate electrode material layer 155 may be formed of one or more types of metallic material and deposited using known methods. In particular, the gate electrode material layer 155 may be formed of a metal material or a combination of metals deposited, e.g., using sputtering or electron beam evaporation. Any known metals commonly used to form gate electrode can be used and the particular metals selected may vary for p-channel and n-channel devices to tune the threshold voltage accordingly. By way of example only, suitable gate metals include, but are not limited to gold (Au), aluminum (Al), titanium (Ti) and/or palladium (Pd). Alternatively, the gate electrode material layer 155 may be foamed of polysilicon (poly-Si), wherein the poly-Si can be doped to attain a desired work function and conductivity. The techniques for poly-Si gate doping are known to those of skill in the art and thus are not described further herein.

Figure 2B:
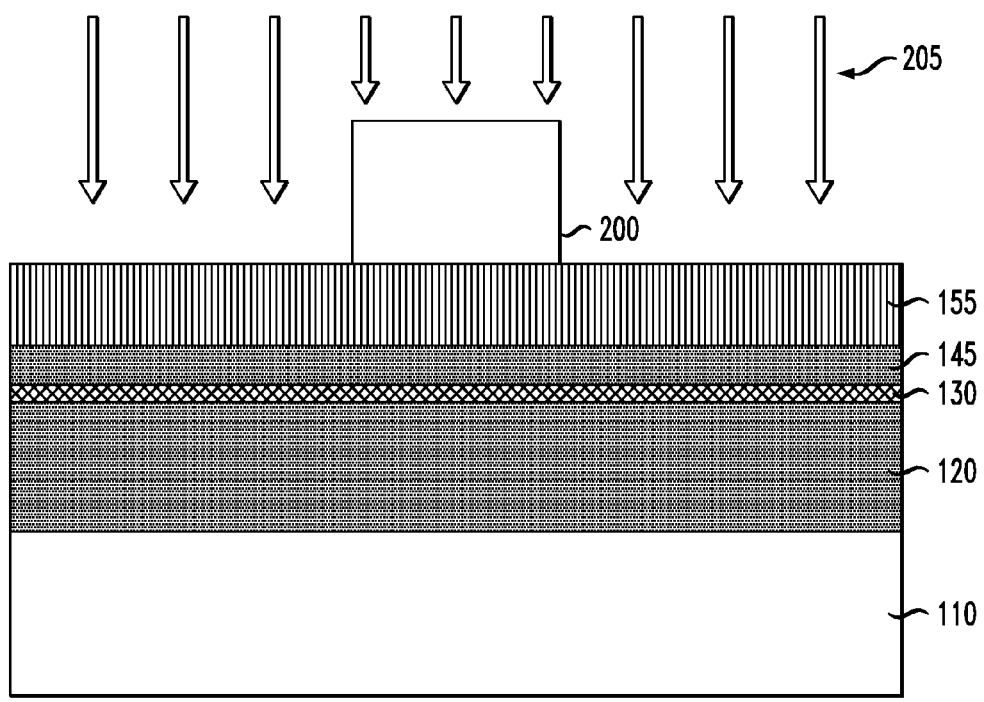

A next step in the exemplary fabrication process comprises etching the gate electrode material layer 155 and the gate dielectric material layer 145 to form a gate stack structure. In particular, FIG. 2B is a cross-sectional view of the structure of FIG. 2A after forming an etch mask 200 using photolithography methods to define a gate region. The lithographic mask 200, which may comprise photoresist or an alternative mask material, serves as an etch mask to etch the gate electrode material layer 155 down to the gate dielectric material layer 145 using first etch process 205. The first etch process 205 may be performed using a dry anisotropic etch process, such as an RIE (reactive ion etch) process, or any other etch process that is commonly used to etch the material forming the gate electrode material layer 155.

Figure 2C:
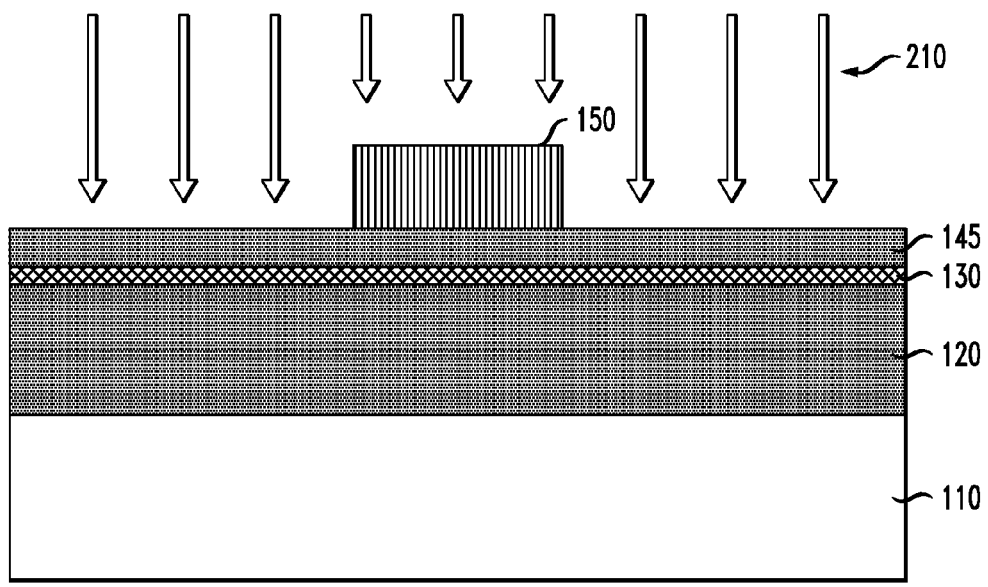
Figure 2D:
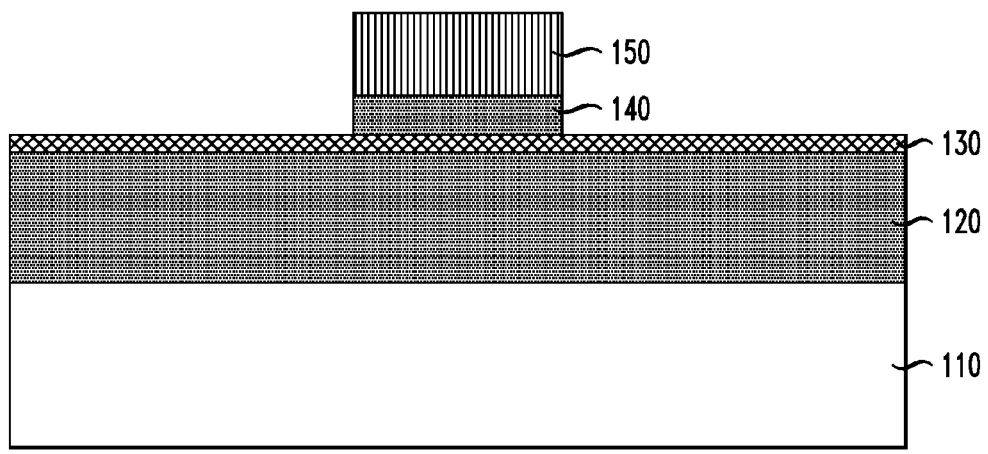

FIG. 2C is a cross sectional view of the structure of FIG. 2B after etching the gate electrode material layer 155 to form the gate electrode 150. A second etch process 210 is then performed to etch the gate dielectric material layer 145 down to the channel layer 130 to form the gate dielectric 140. The gate dielectric material layer 145 may be etched using wet chemical etch process (such as diluted HF) or other methods, which are selective to the channel layer 130 so that no etch damage is done to the channel layer 130 by the dielectric etch process 210. FIG. 2D is a cross-sectional view of the structure of FIG. 2C after etching the gate dielectric material layer 145 down to the channel 130, resulting in the gate stack structure 140/150 shown in FIG. 1

Figure 2E:
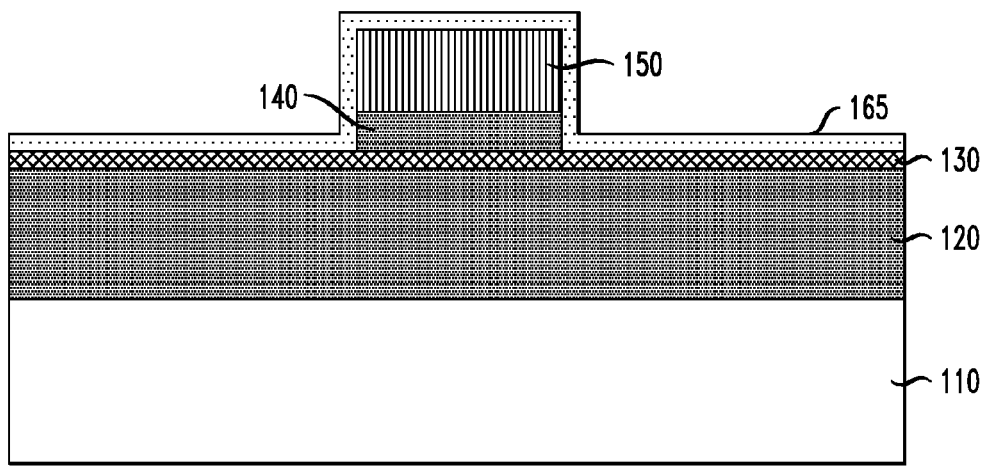

A next step in the exemplary fabrication process is to form a charged monolayer over the structure of FIG. 2D. FIG. 2E is a cross sectional view of the structure of FIG. 2D after conformally forming a charged monolayer 165 that conformally covers the upper and side surfaces of the gate stack 140/150 and the exposed surface of the channel layer 130. In one exemplary embodiment, the charged monolayer 165 can be formed of DNA (providing a DNA nanostructure). Other materials that can serve as a charged monolayer can be used to form the monolayer 165, including, but not limited to, DNA analogues such as LNA etc., Peptides, charged lipid bi-layers, SAM such as PAA, PAH, silanes, etc.

The charged monolayer 165 can be a self-assembled monolayer (SAM). With regard to self-assembled monolayers, it is well known that organic molecules containing certain terminal head groups will self assemble from solution to form monolayers on specific surfaces. The most common monolayers are formed from organic thiols, which attach to gold substrates, organic alkoxy or chloro silanes, which react with silicon dioxide, or phosphonic acids, hydroxamic acids, or carboxylic acids, which react with metal oxides. The monolayers are stabilized by the chemisorption of the head group to the surface and the formation of covalent bonds (in the case of silanes or thiols) or ionic bonding (in the case of acids) of the terminal head group with the surface, as well as intermolecular interactions between the molecules such as van der Waals forces, pi-pi interactions or hydrogen bonding. Self-assembled monolayers are prepared by placing substrates in a solution containing the molecules forming the monolayer in a non-reactive, low boiling solvent.

In accordance with exemplary embodiment of the invention, there are several surfaces, which would require attachment of DNA or other biomolecules when forming the charged monolayer 165. For instance, with regard to metallic materials (e.g., gate electrode 150) requiring metal-biomolecule conjugation, DNA/biomolecule layers can be formed on metals by either direct phys-adsorption of biomolecules onto surfaces or by introducing intermediate self-assembled monolayers. For example, with gold electrodes, thiol chemistry is commonly used for covalently attaching biomolecules to the gold surface. Moreover, oligos can be synthesized with incorporated thiol groups whereas in protein, cysteines constitute of the thiol functional groups naturally.

Furthermore, with regard to the carbon nanostructure materials (e.g., carbon nanotube or graphene) forming the carbon channel layer 130 requiring carbon-biomolecule conjugation, it is known that DNA bases, in specific, have planar aromatic structures that are conducive for coordinating with the hexagonal carbon structure of graphitic material. It is known in the art that all four nitrogenous bases of DNA have strong adsorption affinities to a graphite surface, but the magnitude varies. In this regard, DNA bases can assemble on a graphite surface into a monolayer through hydrogen bonding interactions, in registration with the underlying lattice structure. There is no intermediate chemistry needed for adsorption of DNA onto graphitic surfaces.

Figure 2F:
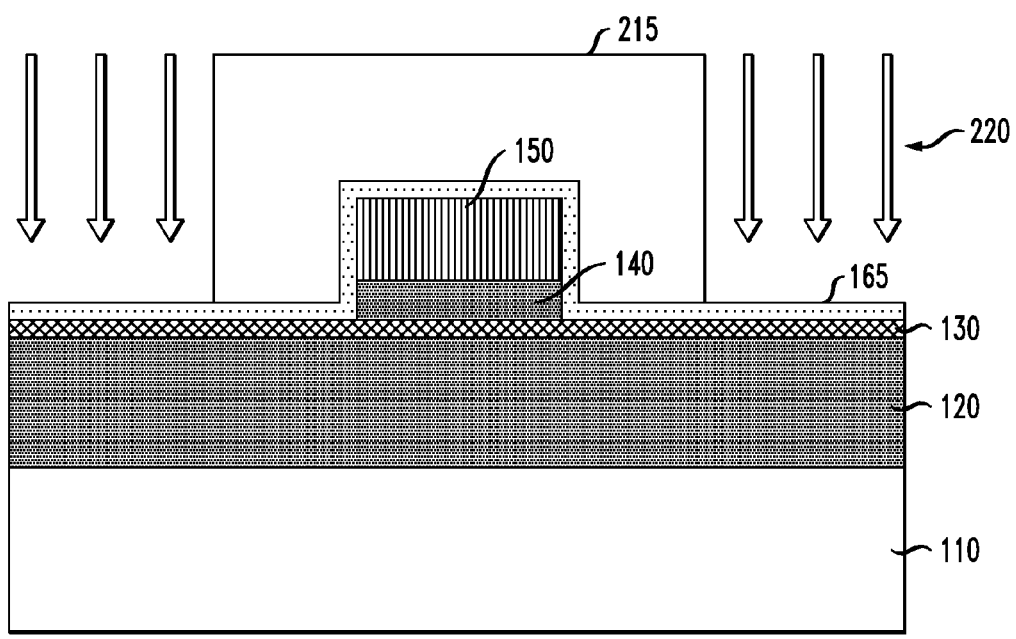

After forming the monolayer 165, a standard photolithography process is performed to etch away portions of the charged monolayer 165 from source/drain contact regions. FIG. 2F is a cross sectional view of the structure of FIG. 2E after forming a photolithographic mask to etch the charged monolayer 165. As shown in FIG. 2F, a photolithographic mask 215 is formed over the gate structure 140/150 and on the portions of the monolayer 165 adjacent the gate stack on the channel 130. An etch process 220 is performed to remove the exposed portion of the monolayer 165 in the source/drain regions to form the charged monolayer liner 160 of FIG. 1. When the charged monolayer 165 is formed of a DNA material, for example, any known proprietary or non-proprietary solution may be used to wet etch a DNA layer in conjunction with a brief acid treatment. Some known solutions can be used to etch a DNA film by cleaving the DNA by breaking phosphodiester bonds along with a thermal anneal. Moreover, an etch process using hydrogen peroxide and/or sodium hydroxide can also be used to remove a DNA film.

Figure 2G:
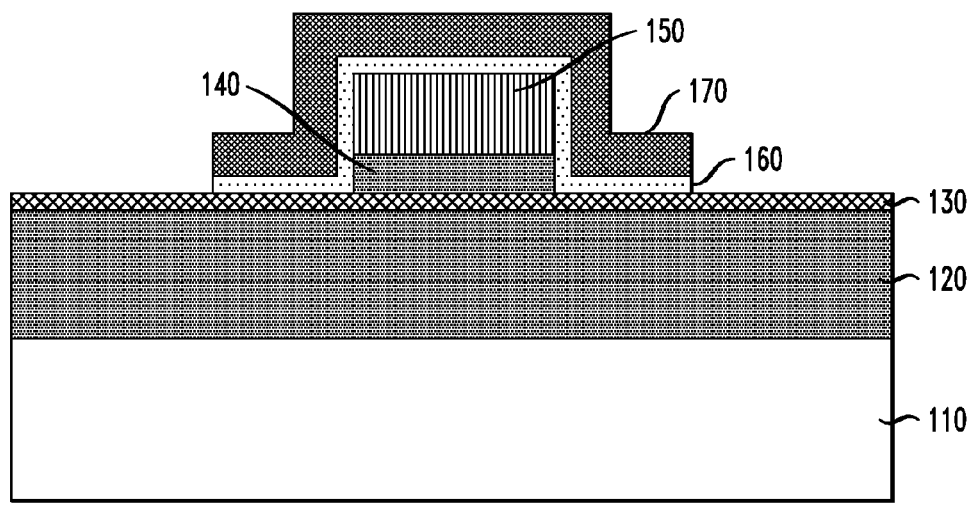

Next, insulating material is deposited to form the insulating spacer 170 shown in FIG. 1. FIG. 2G is a cross sectional view of the structure of FIG. 2F after growing an insulating layer 170 on a surface of the charged monolayer 160. Insulating materials such as SiO2 or nitride can be deposited on the surface of the charged monolayer 160 using ALD, CVD, or other methods. In one exemplary embodiment where the charged monolayer 160 is formed of DNA, the DNA monolayer will serve as the deposition promoter for the insulating material, and consequently, the ALD of the insulating material will only occur on surfaces of the DNA monolayer. The source/drain regions of the carbon channel layer 130 will not be covered by the insulating material being deposited due to inert nature of carbon materials forming the channel layer 130.

Figure 2H:
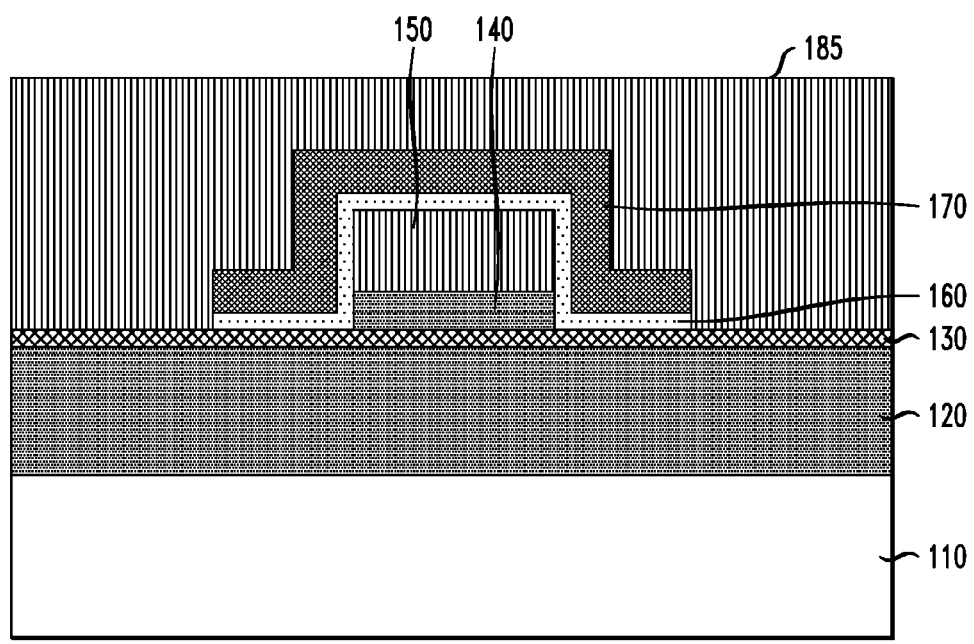

Next, a layer of metallic material is deposited over the structure of FIG. 2G to form source/drain contacts. FIG. 2H is a cross-sectional view of the structure of FIG. 2G after depositing a layer of metallic material 185 that is subsequently etched to form source/drain contacts. In FIG. 2H, the layer of metallic material 185 can be formed by depositing one or more types of metal such as Pd, Al, Ti or other metals, by sputtering, evaporation or other methods. Other possible contact metals include but are not limited to tungsten (W), titanium gold (Au), silver (Ag), molybdenum (Mo), nickel (Ni), palladium (Pd), rhodium (Rh), niobium (Ni), and/or combinations thereof.

Figure 2I:
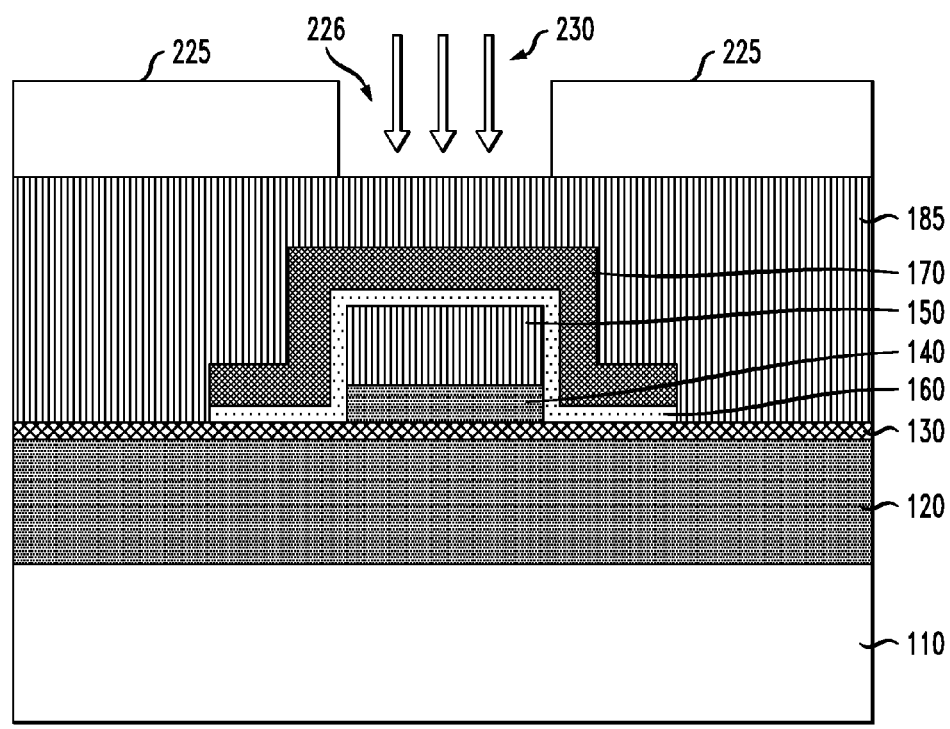

Next, the source/drain contacts 180 shown in FIG. 1 are formed by patterning and etching the layer of metallic material 185 of FIG. 2H. For example, FIG. 2I is a cross-sectional view of the structure of FIG. 2H after foaming a photolithographic mask 225 to etch the layer of metallic material 185. As shown in FIG. 2I, the mask 225 defines an opening 226 above the gate stack structure, which exposes portions of the layer of metallic material 185 that is to be etched away down to the insulating spacer layer 170 using a suitable etch process 230. The etch process 230 may be performed using RIE or other methods for etching the metallic material forming layer 185.

Figure 2J:
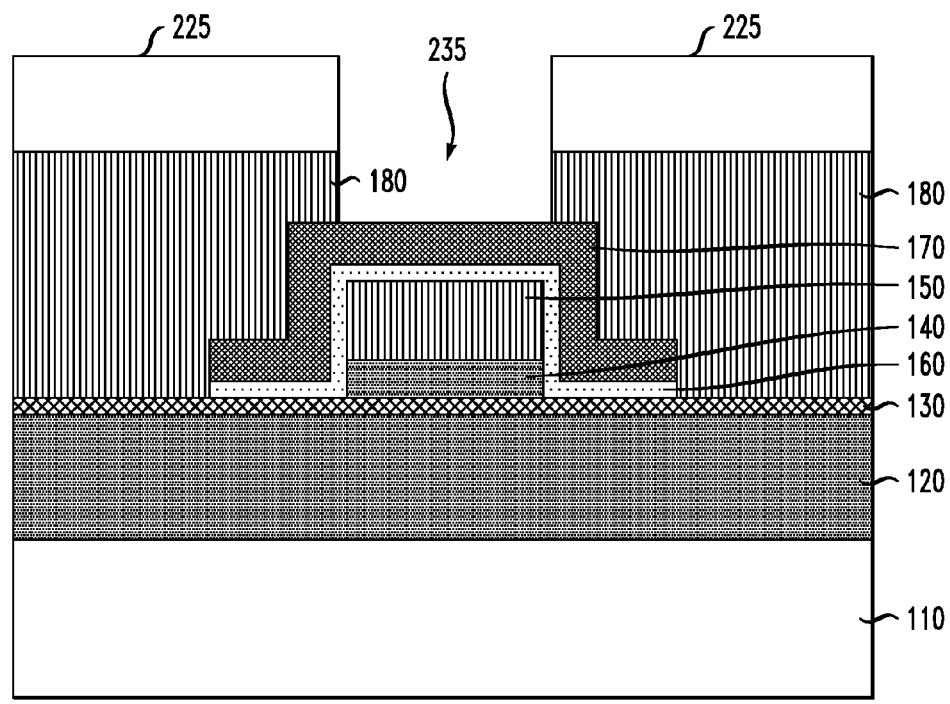

FIG. 2J is a cross-sectional view of the structure of FIG. 2I after etching the layer of metallic material (exposed through the mask) forming an opening 235 down to the insulating spacer layer 170 above the gate stack. With this process, separate source/drain electrodes are formed. Thereafter, the mask 225 is removed to obtain the device as depicted in FIG. 1. In an alternative embodiment, starting with the structure of FIG. 2H, the layer of metallic material 185 can be polished down to the top surface of the insulating spacer 170 using a CMP (chemical mechanical polish) process to form the separate source/drain contacts 180.

It is to be understood that one or more carbon nanostructure FETs, as described herein, can be used in electronic devices, such as diodes and transistors in both analog and digital circuitry, and/or otherwise used to form semiconductor integrated circuits for various types of applications.

Although exemplary embodiments of the present invention have been described herein with reference to the accompanying figures, it is to be understood that the invention is not limited to those precise embodiments, and that various other changes and modifications may be made therein by one skilled in the art without departing from the scope of the appended claims.

What is claimed is:

1. A transistor device, comprising:
   a substrate;
   an insulating layer formed on the substrate;
   a channel comprising a carbon nanostructure formed on the insulating layer;
   a gate structure formed on the channel;
   a charged monolayer conformally covering the gate structure and a portion of the channel adjacent the gate structure, wherein the charged monolayer reduces a parasitic resistance in an ungated portion of the channel covered by the charged monolayer;
   an insulating spacer conformally formed on the charged monolayer; and
   source and drain contacts formed on the channel.

2. The device of claim 1, wherein the carbon nanostructure comprises a carbon nanotube.

3. The device of claim 1, wherein the carbon nanostructure comprises graphene.

4. The device of claim 1, wherein the charged monolayer is a self-assembled monolayer.

5. The device of claim 1, wherein the charged monolayer is formed of DNA.

6. The device of claim 1, wherein the charged monolayer is formed of an organic material.

7. The device of claim 1, wherein the gate structure comprises a dielectric layer on the channel and a metal layer on the dielectric layer.

8. A semiconductor integrated circuit, comprising an insulating substrate, and a plurality of carbon transistor devices formed on the insulating substrate, each of the carbon transistor devices comprising:
   a channel comprising a carbon nanostructure formed on the insulating substrate;
   a gate structure formed on the channel;
   a charged monolayer conformally covering the gate structure and a portion of the channel adjacent the gate structure, wherein the charged monolayer reduces a parasitic resistance in an ungated portion of the channel covered by the charged monolayer;
   an insulating spacer conformally formed on the charged monolayer; and
   source and drain contacts formed on the channel.

9. The semiconductor integrated circuit of claim 8, wherein the carbon nanostructure comprises a carbon nanotube.

10. The semiconductor integrated circuit of claim 8, wherein the carbon nanostructure comprises graphene.

11. The semiconductor integrated circuit of claim 8, wherein the charged monolayer is a self-assembled monolayer.

12. The semiconductor integrated circuit of claim 8, wherein the charged monolayer is formed of DNA.

13. The semiconductor integrated circuit of claim 8, wherein the charged monolayer is formed of an organic material.

14. The semiconductor integrated circuit of claim 8, wherein the gate structure comprises a dielectric layer formed on the channel and a metal layer formed on the dielectric layer.

15. A carbon field effect transistor, comprising:
   a channel comprising a carbon nanostructure formed on an insulating layer;
   a gate structure formed on the channel;
   a monolayer of DNA conformally covering the gate structure and a portion of the channel adjacent the gate structure;
   an insulating spacer conformally formed on the monolayer of DNA; and
   source and drain contacts formed on the channel.

16. The carbon field effect transistor of claim 15, wherein the monolayer of DNA reduces a parasitic resistance in an ungated portion of the channel covered by the monolayer of DNA.

17. A method of forming a transistor device, comprising:
   forming a channel layer on a substrate, the channel layer comprising a carbon nanostructure material;

forming a gate structure on the channel layer;

forming a charged monolayer conformally covering the gate structure and a portion of the channel layer adjacent the gate structure, wherein the monolayer of DNA reduces a parasitic resistance in an ungated portion of the channel covered by the charged monolayer;

forming an insulating spacer conformally on the charged monolayer; and forming source and drain contacts on exposed portions of the channel.

18. The method of claim 17, wherein forming a channel layer comprises forming a carbon nanotube.

19. The method of claim 17, wherein forming a channel layer comprises forming a graphene channel.

20. The method of claim 17, wherein forming a charged monolayer comprises forming a self-assembled monolayer.

21. The method of claim 17, wherein forming a charged monolayer comprises forming a film of DNA material.

22. The method of claim 17, wherein forming a charged monolayer comprises forming a film of organic material.

23. The method of claim 17, wherein forming the gate structure comprises forming a gate dielectric layer on the channel and forming a gate metal layer on the dielectric layer.

24. The method of claim 17, wherein forming an insulating spacer conformally on the charged monolayer comprising growing a conformal insulating layer or material on a surface of the charged monolayer.

* * * * *